United States Patent
Yin et al.

(10) Patent No.: US 8,236,636 B2
(45) Date of Patent: Aug. 7, 2012

(54) HYBRID ORIENTATION SEMICONDUCTOR STRUCTURE WITH REDUCED BOUNDARY DEFECTS AND METHOD OF FORMING SAME

(75) Inventors: Haizhou Yin, Poughkeepsie, NY (US); John A. Ott, Greenwood Lake, NY (US); Katherine L. Saenger, Ossining, NY (US); Chun-Yung Sung, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/972,771

(22) Filed: Dec. 20, 2010

(65) Prior Publication Data

US 2011/0086473 A1 Apr. 14, 2011

Related U.S. Application Data

(62) Division of application No. 11/928,395, filed on Oct. 30, 2007, now Pat. No. 7,863,712.

(51) Int. Cl.
*H01L 21/336* (2006.01)
(52) U.S. Cl. ........ 438/198; 438/197; 438/199; 438/218; 438/275; 438/294; 438/455; 438/973
(58) Field of Classification Search .................. 438/197, 438/198, 199, 218, 275, 294, 455, 973
See application file for complete search history.

(56) References Cited

U.S. PATENT DOCUMENTS

| | | | |
|---|---|---|---|
| 6,777,728 B2 | 8/2004 | Shima et al. | |
| 6,902,962 B2 | 6/2005 | Yeo et al. | |
| 7,608,522 B2 * | 10/2009 | Lin et al. | 438/455 |
| 7,767,510 B2 * | 8/2010 | Wise et al. | 438/198 |
| 2004/0256700 A1 | 12/2004 | Doris et al. | |

(Continued)

FOREIGN PATENT DOCUMENTS

WO 2007092655 8/2007

(Continued)

OTHER PUBLICATIONS

Search Report and Written Opinion of PCT/EP2008/064172 (Jun. 2, 2009).

(Continued)

*Primary Examiner* — Jay C Kim
(74) *Attorney, Agent, or Firm* — Scully, Scott, Murphy & Presser, P.C.; H. Daniel Schnurmann

(57) ABSTRACT

The present invention provides an improved amorphization/templated recrystallization (ATR) method for forming hybrid orientation substrates and semiconductor device structures. A direct-silicon-bonded (DSB) silicon layer having a (011) surface crystal orientation is bonded to a base silicon substrate having a (001) surface crystal orientation to form a DSB wafer in which the in-plane <110> direction of the (011) DSB layer is aligned with an in-plane <110> direction of the (001) base substrate. Selected regions of the DSB layer are amorphized down to the base substrate to form amorphized regions aligned with the mutually orthogonal in-plane <100> directions of the (001) base substrate, followed by recrystallization using the base substrate as a template. This optimal arrangement of DSB layer, base substrate, and amorphized region orientation provides a near-vertical, essentially defect-free boundary between original-orientation and changed-orientation silicon regions, thus enabling complete boundary region removal with smaller footprint shallow trench isolation than possible with ATR methods not so optimized.

20 Claims, 10 Drawing Sheets

U.S. PATENT DOCUMENTS

| | | | |
|---|---|---|---|
| 2005/0093105 | A1 | 5/2005 | Yang et al. |
| 2005/0116290 | A1 | 6/2005 | de Souza et al. |
| 2006/0017137 | A1 | 1/2006 | Iwamatsu |
| 2006/0049460 | A1 | 3/2006 | Chen et al. |
| 2006/0154429 | A1 | 7/2006 | de Souza et al. |
| 2007/0052027 | A1 * | 3/2007 | Ke et al. .................. 257/351 |
| 2007/0241323 | A1 | 10/2007 | Saenger et al. |

FOREIGN PATENT DOCUMENTS

| | | | |
|---|---|---|---|
| WO | WO 2007/092655 | * | 8/2007 |

OTHER PUBLICATIONS

Yang, M. et al., "High Performance CMOS Fabricated on Hybrid Substrate with Different Surface Orientations," IEDM 2003 Paper 18.7.

Jones, K.S. et al., "Effect of implant temperature on transient enhanced diffusion of boron in regrown silicon after amorphization by Si+ or Ge+ implantation" J. Appl. Phys., May 1, 1997, 81 (9).

Burbure, N. et al. "The effect of oxide trenches on defect formation and evolution in ion-implanted silicon," Mat. Res. Soc. Symp. Proc. 810 C4.19 (2004).

Saenger, K.L. et al. "A study of trench-edge defect formation in (001) and (011) silicon recrystallized by solid phase epitaxy," J. Appl. Phys. 101, 024908 (2007).

Saenger, K.L. et al. "Mask-edge defects in hybrid orientation direct-Si-bonded substrates recrystallized by solid phase epitaxy after patterned amorphization," J. Appl. Phys. 101, 084912 (2007).

Howard C.-H. Wang et al., "High-Performance PMOS Devices on (110)/<111'> Substrate/Channel with Multiple Stressors", IEEE, 2006, 4 pages.

* cited by examiner

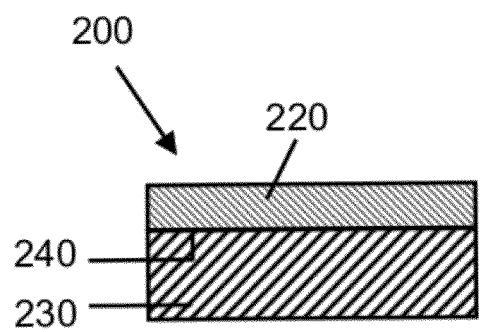
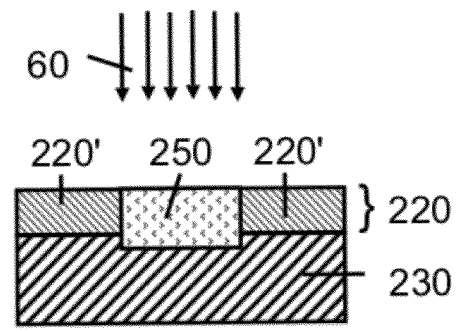
FIG. 6A
FIG. 6B
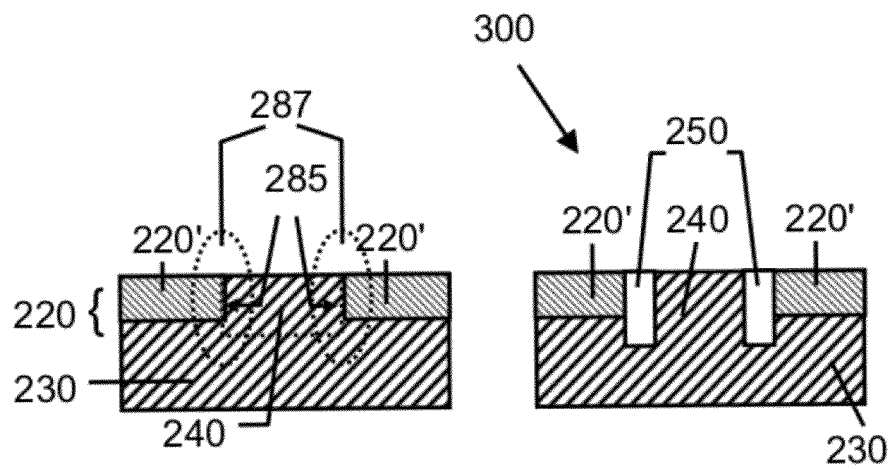
FIG. 6C
FIG. 6D

HYBRID ORIENTATION SEMICONDUCTOR STRUCTURE WITH REDUCED BOUNDARY DEFECTS AND METHOD OF FORMING SAME

RELATED APPLICATION

This application is a divisional of U.S. Ser. No. 11/928,395, filed Oct. 30, 2007, the entire contents of which are incorporated herein by reference.

FIELD OF THE INVENTION

Background of the Invention

The present invention relates to a semiconductor substrate, a semiconductor structure including the semiconductor substrate, and methods of fabricating the same. More particularly, the present invention relates to a hybrid orientation substrate having at least two coplanar regions of different surface orientations wherein the edges of the at least two coplanar regions and the relative in-plane crystal directions of the at least two coplanar regions are oriented so as to make the boundary regions between the at least two coplanar regions as narrow (i.e., as vertical) and as defect free as possible.

Semiconductor device technology is increasingly relying on specialty semiconductor substrates to improve the performance of the n-channel field effect transistors (nFETs) and p-channel field effect transistors (pFETs) in complementary metal oxide semiconductor (CMOS) circuits. For example, the strong dependence of carrier mobility on silicon orientation has led to increased interest in hybrid orientation Si substrates in which nFETs are formed in (100)-oriented Si (the orientation in which electron mobility is higher) and pFETs are formed in (110)-oriented Si (the orientation in which hole mobility is higher), as described by M. Yang, et al. in "High Performance CMOS Fabricated on Hybrid Substrate with Different Surface Orientations," IEDM 2003 Paper 18.7 and U.S. Patent Application Publication No. 2004/0256700 A1 entitled "High-performance CMOS SOI devices on hybrid crystal-oriented substrates."

Amorphization/templated recrystallization (ATR) methods for fabricating hybrid orientation substrates such as disclosed, for example, in U.S. Patent Application Publication No. 2005/0116290 A1 entitled "Planar substrate with selected semiconductor surface orientations formed by localized amorphization and recrystallization of stacked template layers," typically start with a first semiconductor layer having a first orientation directly bonded to a second semiconductor layer having a second orientation different from the first. Selected areas of the first semiconductor layer are amorphized by ion implantation, and then recrystallized into the orientation of the second semiconductor layer using the second semiconductor layer as a crystal template.

FIGS. 1A-1D show a "top amorphization/bottom templating" version of the ATR method of the '290 publication for forming a bulk hybrid orientation Si substrate. In this version of ATR, the first semiconductor layer being amorphized is on the top and the second semiconductor layer acting as a template is on the bottom. Specifically, FIG. 1A shows the starting substrate 10 which comprises a top silicon layer 20 having a first surface orientation, a bottom silicon layer or substrate 30 having a second surface orientation different from the first, and a bonded interface 40 between them. FIG. 1B shows the substrate of FIG. 1A (designated now as 10') after formation of dielectric-filled shallow trench isolation (STI) regions 50. Selected regions of top Si layer 20 are then subjected to amorphizing ion implant 60 to produce one or more amorphized regions 70, as shown in FIG. 1C. The amorphizing ion implant 60 would typically be performed with Si or Ge ions. Amorphized regions 70 span the entire thickness of the upper Si layer 20, and extend into the lower Si layer 30. The amorphized regions 70 are then recrystallized into the second surface orientation, using the lower Si layer 30 as a template, to produce (idealized) planar hybrid orientation substrate 80 with recrystallized, changed-orientation Si region 90. In this example, the orientations of Si regions 30 and 90 may have a (100) orientation, while the Si regions 20 may have a (110) orientation.

In contrast to the idealized outcome shown in FIG. 1D, recrystallization of the amorphized Si region 70 in the structure of FIG. 1C would typically result in the structure of FIG. 2A, with end-of-range defects 97 and trench-edge defects 99. End-of-range defects are well studied and have been reported in, for example, K. S. Jones et al. "Effect of implant temperature on transient enhanced diffusion of boron in regrown silicon after amorphization by $Si^+$ or $Ge^+$ implantation" J. Appl. Phys. 81 (9), 1 May 1997, and trench-edge defects have been described previously by N. Burbure and K. S. Jones in "The effect of oxide trenches on defect formation and evolution in ion-implanted silicon," Mat. Res. Soc. Symp. Proc. 810 C4.19 (2004) and K. L. Saenger et al. in "A study of trench-edge defect formation in (001) and (011) silicon recrystallized by solid phase epitaxy," J. Appl. Phys. 101, 024908 (2007). As described in U.S. Patent Application Publication No. 2006/0154429 A1, end-of-range defects 97 remaining after ATR may be eliminated by including a high temperature (approximately 1300° C.) anneal as part of the recrystallization process, as shown in FIG. 2B. However, this high temperature annealing is not expected to be effective in eliminating trench-edge defects 99.

FIGS. 3A-3E show the geometry of trench-edge defects 99 in relation to a FET device that might comprise ATR'd region 90. Specifically, FIGS. 3A-3B show top views of ATR'd region 90 with (FIG. 3B) and without (FIG. 3A) FET gate and gate dielectric 112. In this example, ATR'd region 90 has a (001) surface orientation and rectilinear edges aligned with the in-plane <110> directions of the (001) crystal, as is typical for FETs in (001) silicon. Reference numeral 50 denotes the dielectric filled trench region. FIGS. 3C-3E show cross section views of FIG. 3B through lines C-C1, D-D1, and E-E1, respectively. Trench-edge defects 99 are a particular concern in circled regions 118, where they are directly under FET gate and gate dielectric 112 and may contribute to undesirable leakage.

One could devise methods to repair trench-edge defects 99, but none appear to be very practical. For example, one could re-amorphize the ATR'd regions to a shallower depth than the initial amorphization, and then recrystallize. This would still leave trench-edge defects, but they would be smaller, since the trench-edge defect size scales with the amorphization depth, as discussed in the publication by Burbure and Jones mentioned above. Alternatively one could remove the trench-edge defect regions and replace them with an insulator or epitaxially-grown Si. However, the steps to do this are quite complicated. It is therefore clear that the preferred approach would be to avoid forming trench-edge defects in the first place.

Trench-edge defect formation can be avoided with the ATR-before-STI process flow of FIGS. 4A-E. Specifically, FIG. 4A shows a starting substrate 10 such as shown in FIG. 1A. FIG. 4B shows the substrate 10 of FIG. 4A being subjected to amorphizing ion implant 60 to produce one or more amorphized regions 120 and non-amorphized regions 20'.

Amorphized regions 120 span the entire thickness of the upper Si layer 20, and extend into the lower Si layer 30. Amorphized regions 120 are then recrystallized using the lower Si layer 30 as a template to produce ATR'd changed-orientation Si region 130. In conventionally oriented hybrid orientation substrates, ATR'd changed-orientation regions 130 would have a (001) surface orientation and rectilinear edges aligned with the in-plane <110> directions of the (001) base substrate 30, and original-orientation region 20' would have a (011) surface orientation and rectilinear edges aligned with the mutually orthogonal in-plane <110> and <100> directions of the original-orientation (011) region 20'. As described in K. L. Saenger et al., "Mask-edge defects in hybrid orientation direct-Si-bonded substrates recrystallized by solid phase epitaxy after patterned amorphization," J. Appl. Phys. 101, 084912 (2007), changed-orientation regions 130 are bordered below by end-of-range defects 97 and bordered laterally by boundary regions 140. For the conventional hybrid orientation substrate geometry, boundary regions 140 comprise angled edges 141 and, for feature edges parallel to in-plane <110> directions of the original orientation (011) region 20', high-defectivity triangular regions 142 bounded by {111} planes of the upper (011) and lower (001) Si layers, as shown in FIG. 4C. Edge regions 140 are then replaced by STI regions 150, as shown in FIG. 4D. If desired, an optional high-temperature defect-removal anneal may be performed to remove end-of range defects 97, as shown in FIG. 4E.

While solving the trench-edge defect problem, the ATR-before-STI approach of FIGS. 4A-4E is only satisfactory when the lateral dimensions of STI regions 150 exceed the lateral dimensions of boundary regions 140. As device dimensions shrink, it becomes increasingly likely that the dimensions of STI regions 150 will have to be larger than desired in order to eliminate the boundary regions between original-orientation regions 20' and ATR'd changed-orientation regions 130.

In view of the above, there is a continued need for developing new and improved methods of fabricating a hybrid orientation substrate in which the boundary regions between the changed-orientation and original-orientation regions are as narrow (i.e., as vertical) and as defect free as possible.

SUMMARY OF THE INVENTION

The present invention provides an improved amorphization/templated recrystallization (ATR) method for forming low-defect density hybrid orientation substrates. The improved method utilizes a specially selected combination of direct semiconductor bonded (DSB) silicon layer orientation, base substrate orientation, and device orientation to produce boundary regions between changed-orientation and original-orientation regions that are near-vertical and essentially defect free, in contrast to the angled and defective boundary regions produced by ATR methods employed with conventionally-oriented DSB wafers.

Specifically, the ATR method of the present invention comprises fabricating a hybrid orientation substrate by: (i) forming a bilayer template stack comprising a DSB silicon layer having a (110) surface orientation disposed on a base silicon substrate having a (100) surface orientation, (ii) amorphizing selected regions of the DSB silicon layer down to the base silicon substrate to leave the DSB silicon layer with amorphized and original-orientation regions, and (iii) performing a recrystallization anneal to convert the amorphized regions of the DSB silicon layer into regions of changed-orientation silicon having the orientation of the base silicon substrate, wherein the relative in-plane crystal directions of the DSB silicon layer, the base silicon substrate, and the changed-orientation silicon regions are specially oriented with respect to favored crystal planes so as to make the boundary regions between the original-orientation and changed-orientation silicon regions as vertical and as defect free as possible.

Hybrid orientation substrates fabricated in the present invention typically include at least one trench isolation region such as, for example, a shallow trench isolation (STI) region, which laterally separates the original-orientation and changed-orientation regions of the DSB silicon layer. The at least one trench isolation region is formed after the amorphization and recrystallization anneal steps.

More specifically, a DSB silicon layer having a (011) surface crystal orientation is bonded to a base silicon substrate having a (001) surface crystal orientation to form a DSB substrate in which the in-plane <110> direction of the (011) DSB layer is parallel to (i.e., aligned with) the in-plane <110> direction of the (001) base substrate. Edges of rectilinear changed-orientation silicon regions in this DSB wafer are aligned with the mutually orthogonal in-plane <100> directions of the (001) base substrate. This optimal arrangement of DSB layer, base substrate, and changed-orientation silicon regions provides a near-vertical, essentially defect-free boundary between original-orientation and changed-orientation silicon regions. This observed result relies on two peculiarities in silicon solid phase epitaxy (SPE) discussed in the aforementioned two articles to K. L. Saenger presented in J. Appl. Phys (e.g., the '084912 and '024908 articles), namely that (i) SPE on {111} planes is essentially zero and (ii) SPE of rectilinear amorphized regions in (001) silicon proceeds without trench-edge defects if the edges of the amorphized regions are aligned with the (001) crystal's in-plane <100> directions. For the present case, rectilinear regions of amorphized silicon with edges aligned with the in-plane <100> directions of the (001) base substrate in these DSB wafers will also have vertical sides very closely aligned with the slow-growth {111} planes of the (011) silicon DSB layer. As a consequence, there is essentially no laterally-templated recrystallization from the (011) DSB layer; the patterned amorphized regions are entirely recrystallized by trench-edge defect-free SPE templating from the (001) base substrate, resulting in boundary regions that are near-vertical and essentially defect free (where the term "defect-free" denotes a region free of high-defectivity triangular regions bounded by {111} planes of the DSB layer and base silicon layer).

Hybrid orientation substrates fabricated in the present invention typically include at least one trench isolation region such as, for example, a shallow trench isolation (STI) region, which laterally separates the original-orientation and changed-orientation regions of the DSB silicon layer. The at least one trench isolation region is formed after the amorphization and recrystallization steps. A particular advantage of the present invention is that the STI trenches may be narrower than $Q^*t_{DSB}$, where Q=1.06 and $t_{DSB}$ is the DSB layer thickness [see K. L. Saenger et al., '084912 discussed above], while still being wide enough to remove all boundaries between changed-orientation and original-orientation silicon regions falling within the DSB layer thickness. The invention thus includes embodiments in which original-orientation and changed-orientation silicon regions may be disposed on opposite sides of the same STI trench, with the STI trench being narrower than $Q^*t_{DSB}$ and the silicon in contact with the STI trench free of all defects (excepting the original DSB interface).

In general terms, the present inventive method for forming a hybrid orientation substrate comprises the steps of:

providing a bilayer template stack comprising a direct semiconductor bonded (DSB) silicon layer of a (011) surface orientation disposed on a base silicon layer having a (001) surface orientation, wherein an in-plane <110> direction of the DSB layer and an in-plane <110> direction of the base silicon layer are aligned to be parallel;

implanting amorphizing ions into selected regions of the DSB silicon layer to amorphize the selected regions down to the base silicon layer, leaving original-orientation regions of DSB layer in regions not so implanted, wherein edges of the selected regions are aligned with the in-plane <100> directions of the base silicon layer; and performing a recrystallization anneal to convert said amorphized selected regions into changed-orientation regions having the (001) surface orientation of the base silicon layer, wherein edges of said changed-orientation and original orientation silicon regions are separated by a near-vertical boundary in a boundary region.

In the present invention and the following embodiments, the term "near-vertical" includes an angle within 15° of vertical, and, more typically, and angle within 5° to 10° of vertical. Likewise, the terms "aligned with" and "aligned to be parallel" should be more broadly construed to include an alignment that is within 5° to 10° of parallel.

In most embodiments, the present inventive method further includes the step of removing at least one boundary region after the recrystallization anneal and replacing the at least one boundary region with at least one trench isolation region such as, for example, a shallow trench isolation (STI) region, thereby laterally separating the original-orientation and changed-orientation regions of the hybrid orientation DSB silicon layer.

In a preferred embodiment of the present invention, the bilayer template stack comprises a DSB silicon layer having a (011) surface orientation upon a bulk base silicon wafer having a (001) surface orientation.

In another embodiment of the present invention, the bilayer template stack comprises a DSB silicon layer having a (011) surface orientation upon a semiconductor-on-insulator (SOI) wafer having a (001) surface orientation.

In this invention and the following embodiments, the term "silicon" when used in describing the DSB layer, first and/or second silicon regions, and the base silicon layer denotes any semiconductor material that includes silicon. Hence, the term "silicon" is used herein to denote a Si-containing semiconductor material. Illustratively, the term "silicon" thus includes wafers comprised of Si, SiGe, SiC, SiGeC, and multilayered stacks thereof such as, for example, Si/SiGe.

In even further embodiments of the present invention, a buried insulating region or layer may be formed in the inventive substrate after the recrystallization anneal. The buried insulating region or layer can be formed within or under the DSB silicon layer, i.e., within or under both original-orientation and changed-orientation regions; within or under selected portions of the DSB silicon layer, for example, only within or under one or more original-orientation regions or only within or under the one or more changed-orientation region; or any combination of the foregoing embodiments.

Another aspect of the present invention relates to a method of forming a semiconductor structure in which at least one semiconductor device is located within or upon the original-orientation and changed-orientation regions of the hybrid orientation DSB silicon layer. The inventive method comprises the steps of:

providing a bilayer template stack comprising a direct semiconductor bonded (DSB) silicon layer of a (011) surface orientation disposed on a base silicon layer having a (001) surface orientation, wherein an in-plane <110> direction of the DSB layer and an in-plane <110> direction of the base silicon layer are aligned to be parallel;

implanting amorphizing ions into selected regions of the DSB silicon layer to amorphize the selected regions, leaving original-orientation regions of DSB layer in regions not so implanted, wherein edges of the selected regions are aligned with the in-plane <100> directions of the base silicon layer;

performing a recrystallization anneal to convert said amorphized selected regions into changed-orientation regions having the (001) surface orientation of the base silicon layer, wherein edges of said changed-orientation and original orientation silicon regions are separated by a near-vertical boundary in a boundary region; and forming a first device on an original-orientation region of said DSB layer and forming a second device on a changed-orientation region of said DSB layer.

In some embodiments of this aspect of the present invention, the first and second devices are field effect transistors of different conductivity, i.e., pFETs and nFETs. In a preferred embodiment, the pFETs are formed on original-orientation (011) regions of the DSB layer and nFETs are formed on changed-orientation (001) regions of the DSB layer.

In addition to the above, the present invention also relates to a hybrid orientation substrate that has at least two coplanar surface regions of different surface orientation.

More specifically, the present invention provides a hybrid orientation substrate comprising: a first silicon region having a (011) surface orientation coplanar with a second silicon region having a (001) surface orientation, wherein said first and second silicon regions are disposed on a base substrate;

an in-plane <110> direction of the first silicon region is parallel to an in-plane <110> direction of the second silicon region;

edges of said first and second silicon regions are aligned with the in-plane <100> directions of the second silicon region; and said first and second silicon regions are separated by a near-vertical boundary in a boundary region.

In most embodiments, the hybrid orientation substrate provided further includes trench isolation region such as, for example, shallow trench isolation (STI) regions, in at least one boundary region between said first and second silicon regions.

In a preferred embodiment of the present invention, the base substrate is a bulk silicon wafer having a (001) surface orientation.

In another embodiment of the present invention, the base substrate is a semiconductor-on-insulator (SOI) wafer having a (001) surface orientation.

Another aspect of the present invention provides a semiconductor structure in which at least one semiconductor device is located within or upon a hybrid orientation substrate comprising: a first silicon region having a (011) surface orientation coplanar with a second silicon region having a (001) surface orientation, wherein said first and second silicon regions are disposed on a base substrate;

an in-plane <110> direction of the first silicon region is parallel to an in-plane <110> direction of the second silicon region; and edges of said first and second silicon regions are aligned with the in-plane <100> directions of the second silicon region.

In some embodiments of this aspect of the present invention, the first and second devices are field effect transistors of different conductivity, i.e., pFETs and nFETs. In a preferred embodiment, the pFETs are formed on first silicon regions having a (011) surface orientation and nFETs are formed on second silicon regions having a (001) surface orientation.

In most embodiments of this aspect of the present invention, the hybrid orientation substrate provided further includes trench isolation region such as, for example, shallow trench isolation (STI) regions, in at least one boundary region between said first and second silicon regions.

In even further embodiments of the present invention, the hybrid orientation substrate provided may also include buried insulating regions or layers within or under one or both of the first and second silicon regions.

BRIEF DESCRIPTION OF THE DRAWINGS

FIGS. 6A-6D are pictorial representations (through cross sectional views) depicting the basic processing steps of the present invention.

DETAILED DESCRIPTION OF THE INVENTION

Figure 1A:
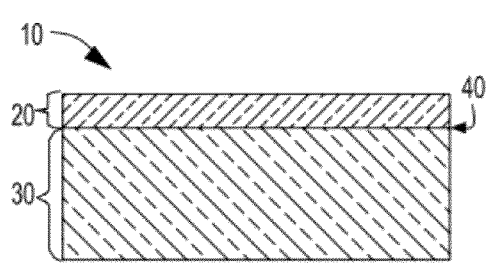
FIGS. 1A-1D are pictorial representations (through cross sectional views) illustrating an idealized top amorphization/bottom templating STI-before-ATR prior art process for forming a hybrid orientation Si substrate.
Figure 1B:
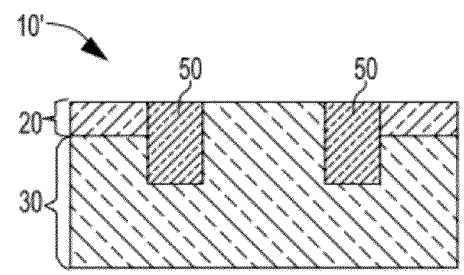
Figure 1C:
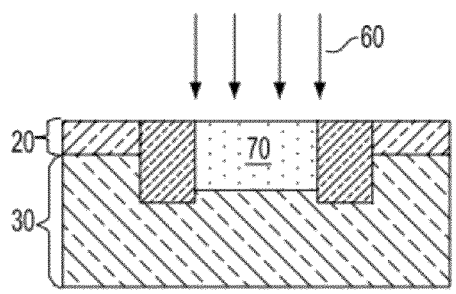
Figure 1D:
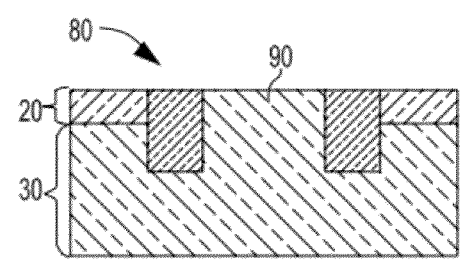
Figure 2A:
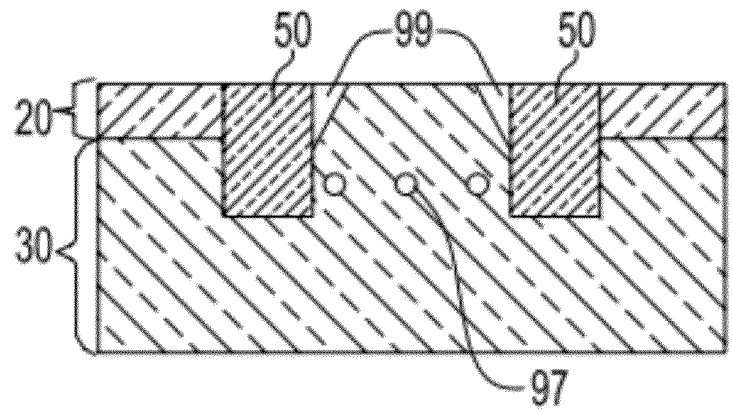
FIGS. 2A-2B are pictorial representations (through cross sectional views) illustrating the types and locations of defects remaining after the prior art STI-before-ATR process of FIG. 1.
Figure 2B:
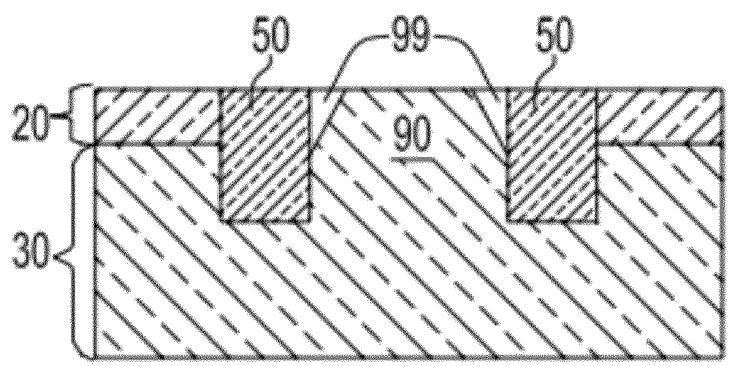
Figure 3A:
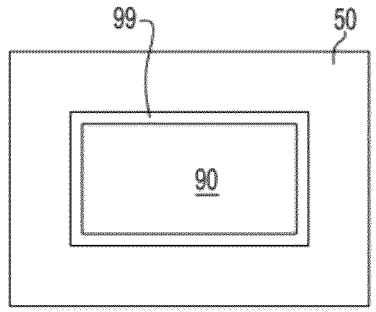
FIGS. 3A-3E show the geometry of the trench-edge defects in relation to a FET device comprising changed-orientation ATR'd regions through plan views (FIGS. 3A and 3B) and cross sectional views (FIGS. 3C-3E).
Figure 3B:
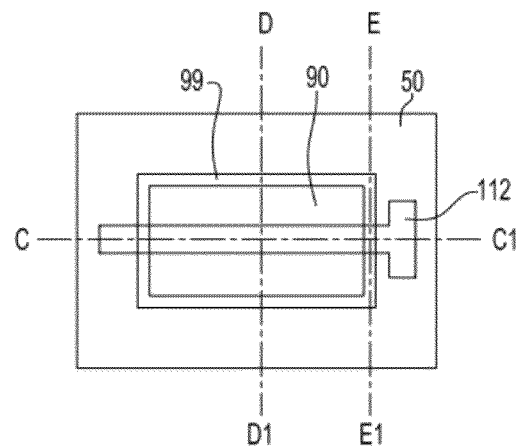
Figure 3C:
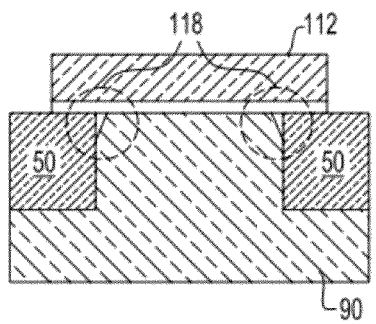
Figure 3D:
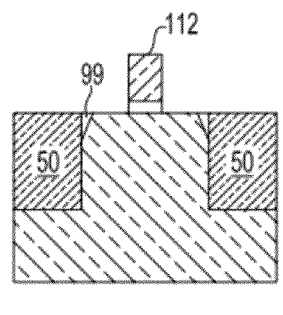
Figure 3E:
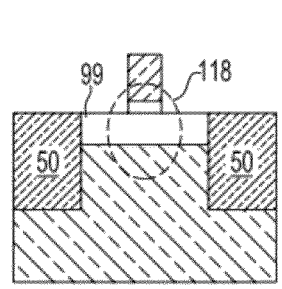
Figure 4A:
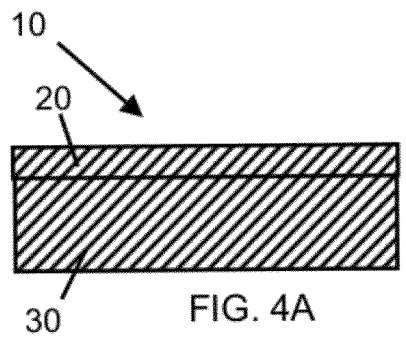
FIGS. 4A-4E are pictorial representations (through cross sectional views) illustrating a top amorphization/bottom templating ATR-before-STI prior art process for forming a hybrid orientation Si substrate.
Figure 4B:
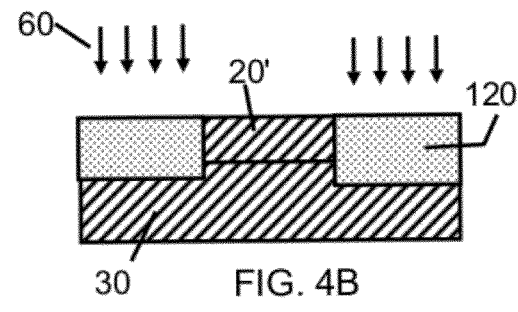
Figure 4C:
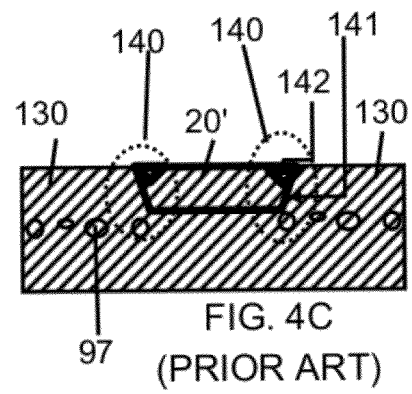
Figure 4D:
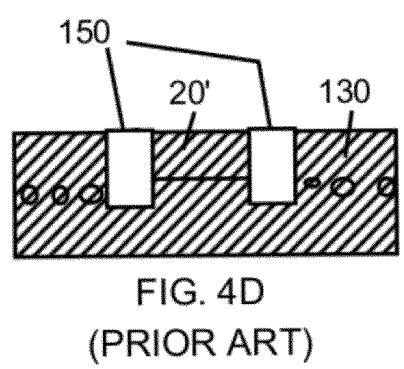
Figure 4E:
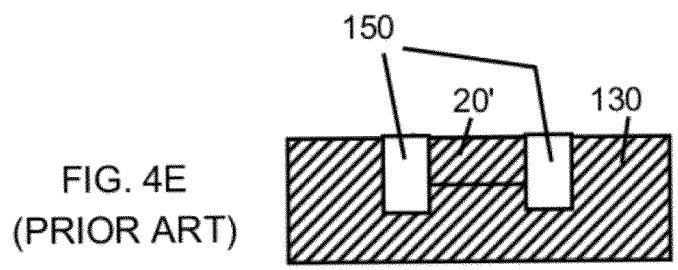

The present invention, which describes a modified ATR method for minimizing boundary defects in hybrid orientation substrates, will now be described in more detail by referring to the drawings that accompany the present application. In the accompanying drawings, like and corresponding elements are referred to by like reference numerals. It is also noted that the drawings of the present invention representing the structures during the various processing steps of the present invention are provided for illustrative purposes and are thus not drawn to scale.

In the following description, numerous specific details are set forth, such as particular structures, components, materials, dimensions, processing steps and techniques, in order to provide a thorough understanding of the present invention. However, it will be appreciated by one of ordinary skill in the art that the invention may be practiced without these specific details. In other instances, well-known structures or processing steps have not been described in detail in order to avoid obscuring the invention.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

As stated above, and in one aspect of the present invention, a method of forming a hybrid orientation substrate is provided that minimizes and/or eliminates boundary defects. The method includes first providing a bilayer template stack comprising a direct semiconductor bonded (DSB) silicon layer of a (011) surface orientation disposed on a base silicon layer having a (001) surface orientation, wherein an in-plane <110> direction of the (011) DSB layer and an in-plane <110> direction of the (001) base silicon layer are aligned to be parallel. Amorphizing ions are implanted into selected regions of the (011) DSB silicon layer to provide amorphized regions extending to underlying (001) base silicon layer, and to leave original-orientation regions of DSB layer in regions not so implanted. In accordance with the invention, edges of the regions selected for amorphization are aligned with the mutually orthogonal in-plane <100> directions of the (001) base silicon layer. A recrystallization anneal is then performed to convert the amorphized regions of the DSB silicon layer into regions of changed-orientation silicon having the orientation of the base silicon.

The above described method provides a hybrid orientation substrate that includes a direct semiconductor bonded silicon wafer having first regions with a (011) surface orientation region and second regions with a (001) surface orientation, both regions disposed on a base silicon layer having the (001) orientation of the second silicon regions, and wherein the in-plane <110> direction of the (011) first regions is aligned with an in-plane <110> direction of the (001) second regions.

Figure 5A:
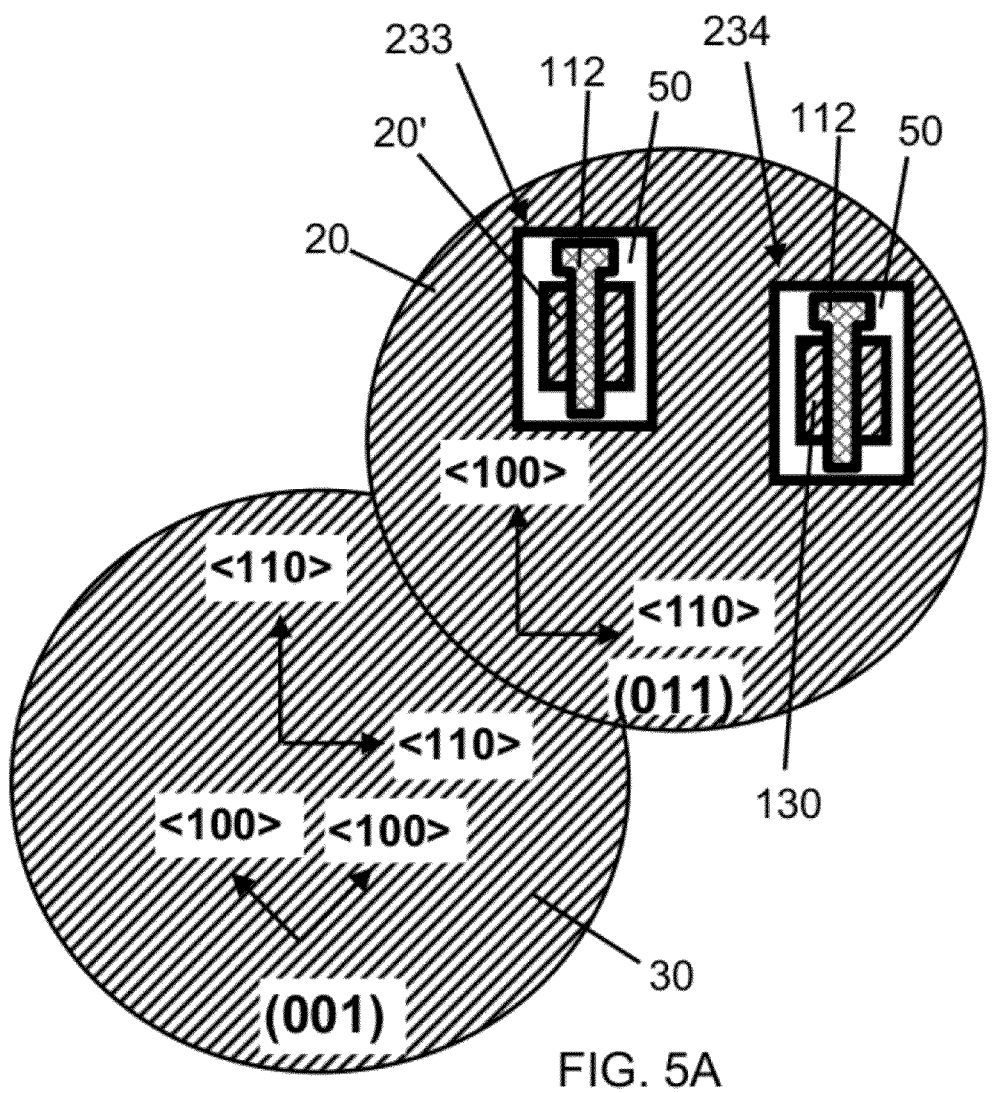
FIGS. 5A and 5B are pictorial representations (top down view) comparing the prior art DSB configuration and the inventive DSB configuration of the present invention.
Figure 5B:
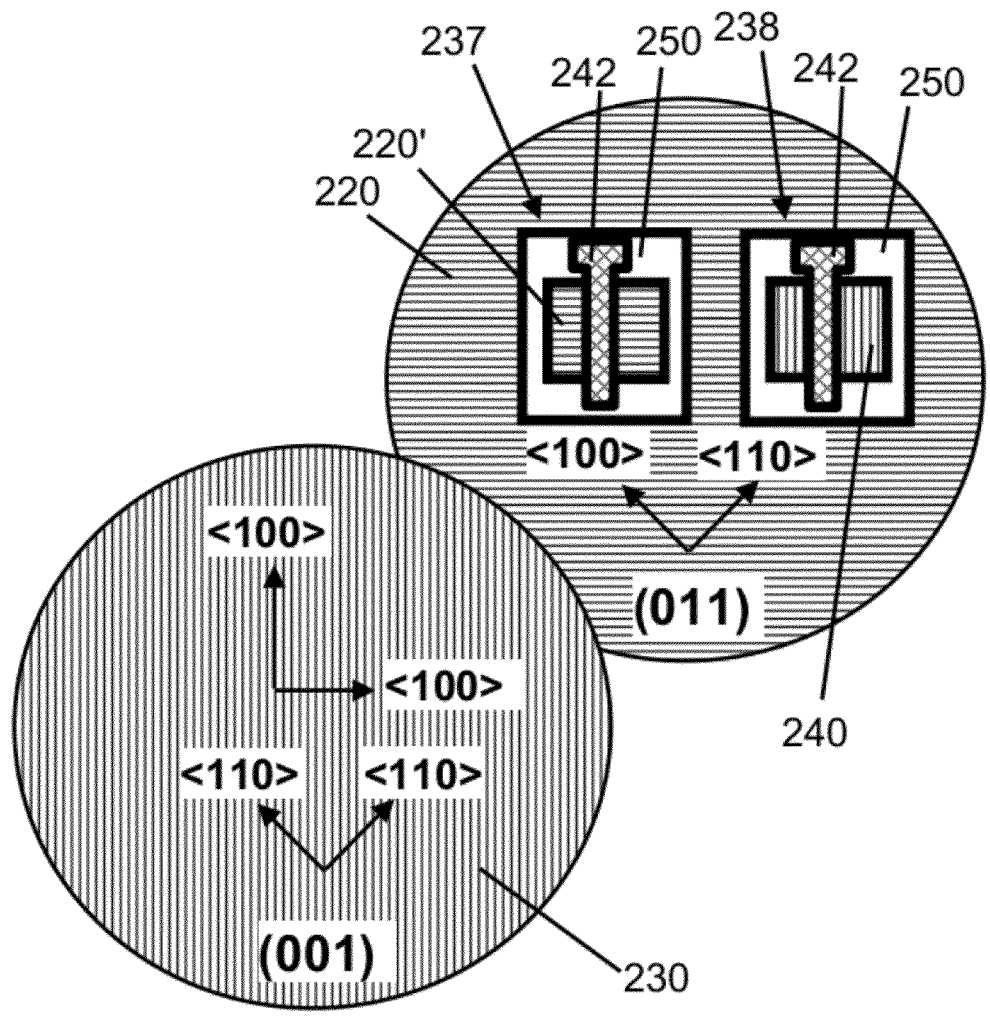

Reference is now made to FIGS. 5A and 5B which are pictorial representations (top down view) comparing the prior art DSB wafer and FET configuration (FIG. 5A) and the inventive DSB wafer and FET configuration of the present invention (FIG. 5B). In the prior art, DSB layer 20 has a (011) surface orientation and base substrate layer 30 has a (001) surface orientation. Layers 20 and 30 are bonded so that the in-plane <110> direction of the (011) DSB layer is aligned with an in-plane <110> direction of the (001) base substrate layer. FET 233 (formed in region of DSB silicon layer 20') and FET 234 (formed in a silicon region 130 having the surface orientation and alignment of base substrate layer 30) comprise gates 112 and STI regions 50, and are aligned with the in-plane <110> directions of base substrate layer 30. As in the prior art, the present invention, shown in FIG. 5B, has a DSB layer 220 with a (011) surface orientation and base substrate layer 230 with a (001) surface orientation, with layers 220 and 230 bonded so that an in-plane <110> direction of the (011) DSB layer is aligned with an in-plane <110> direction of the (001) base substrate layer. FET 237 (formed in region of DSB silicon layer 220') and FET 238 (formed in a silicon region 240 having the surface orientation and alignment of base substrate layer 230) comprise gates 242 and STI regions 250. However, in contrast to the prior art in which FETs 233 and 234 are aligned with the in-plane <110> directions of the (001) base substrate layer (30 in FIG. 5A), FETs 237 and 238 are aligned with the in-plane <100> directions of the (001) base substrate layer (230 in FIG. 5B).

Reference is first made to FIGS. 6A-6D which are pictorial representations (through cross sectional views) illustrating the basic processing steps of a preferred embodiment of the inventive method for forming a hybrid orientation substrate with no trench-edge defects.

FIG. 6A shows a starting bilayer template stack 260 that is employed in the present invention. As is illustrated, the bilayer template stack 260 comprises a direct semiconductor bonded silicon layer 220 of a (011) surface orientation disposed on a base silicon layer 230 having a (001) surface orientation. A bonding interface 270 is present between the two wafers.

The two layers (220 and 230) are each composed of a Si-containing semiconductor material such as, for example, silicon, SiGe, SiGeC and SiC. Each of the Si-containing semiconductor layers may also be comprised of a layered stack of such Si-containing semiconductors. In some embodiments, the layers may also be silicon-on-insulator or SiGe-on-insulator substrates (i.e., semiconductor-on-insulator substrates). Each of the wafers present in the above mentioned bilayer template stack may be strained, unstrained, or contain a combination of strained and unstrained layers or regions. An example of a combination of strained and unstrained layers is a wafer including strained Si on relaxed SiGe.

The bilayer template stack 260 shown in FIG. 6A is fabricated utilizing direct semiconductor to semiconductor wafer bonding techniques that are well known to those skilled in the art. Specifically, direct semiconductor to semiconductor wafer bonding is achieved by first bringing a base substrate containing a base semiconductor layer having a first surface orientation into intimate contact with a semiconductor donor wafer containing a semiconductor donor layer having a second surface orientation that is different from the first. An optional external force may be applied to the contact wafers. Typically, direct wafer bonding is achieved during the initial contact step at nominal room temperature. By "nominal room temperature," it is meant a temperature from about 15° C. to about 40° C., with a temperature of about 25° C. being more preferred.

After bonding, the wafers are typically, but not necessarily always, subjected to a first anneal under conditions that are capable of increasing the bonding strength and improve the interface property. The first anneal is typically carried out at a temperature from about 900° to about 1300° C., with an annealing temperature from about 1000° to about 1100° C. being more typical. The first anneal is performed within the aforementioned temperature range for various periods of time that may range from about 1 hour to about 24 hours. The annealing ambient includes $O_2$, $N_2$, Ar, or a low vacuum. Mixtures of the annealing ambients, with or without an inert gas, are also contemplated herein. After the bonding anneal, the semiconductor donor wafer is removed to leave behind the semiconductor donor layer. Additional high temperature annealing may be performed as desired to dissolve away any interfacial oxides at interface 270.

FIG. 6B shows bilayer template stack 260 of FIG. 6A being subjected to an amorphizing ion implant 60 to produce one or more amorphized regions 280 and non-amorphized regions 220'. Although not shown in FIG. 6B, the amorphizing ion implant 60 would typically be a blanket implant and regions 220' would typically be masked by some type of photoresist. Amorphized region 280 spans the entire thickness of the DSB silicon layer 220, and extends into the base silicon layer 230.

The amorphization implant is performed utilizing amphorization ions and conditions that are well known to those skilled in the art. For example, the amorphization ion being implanted at this step of the present invention may include ions of As, Ge, P, Si, or Xe, with ions Ge and Si being preferred. Any range of dose and energy that is sufficient to cause amorphization of the entire thickness of DSB silicon layer 220 may be used in the present invention. The optimum ion energy and dose range for amorphization depend on the ion being implanted and the thickness of the DSB layer. For a DSB layer 100 nm in thickness and $Ge^+$ ions, a suggested implant energy would be in the range 90 to 100 keV and a suggested ion dose would be in the range 5e14 to about 2e15 atoms/cm$^2$. Thicker DSB layers would typically require higher ion energies and higher doses.

Amorphized regions 280 are then recrystallized by a recrystallization anneal to produce changed-orientation Si regions 240 having the orientation of the underlying base silicon wafer 230 (which acts as a template). The resultant structure that is formed, including near-vertical boundaries 285 in boundary regions 287 between original-orientation regions 220' and changed orientation regions 240, is shown in FIG. 6C.

The recrystallization anneal used to convert the structure of FIG. 6B into the structure of FIG. 6C may be performed with any of a variety of prior art recrystallization conditions, such as, for example, temperatures from about 500° C. to about 900° C. Annealing at temperatures in the range from about 600° C. to about 650° C. in inert ambients for times of about 1 minute to about 2 hours are considered particularly preferable. In general, the annealing temperature should be high enough to produce a reasonable rate of recrystallization, yet low enough to ensure that the recrystallization is templated (rather than spontaneous and random). It is further noted that the recrystallization should however be performed under conditions mild enough to preserve the integrity of the non-ATR'd regions 220'. However, the non-ATR'd regions 220' are expected to be stable at all temperatures in the range typically used for recrystallization annealing.

FIG. 6D shows the structure of FIG. 6C after formation of trench isolation regions 250 such as dielectric-filled shallow trench isolation (STI) regions to produced hybrid orientation substrate structure 300. The trench isolation regions 250 are formed utilizing conventional techniques well known to those skilled in the art including, for example, lithography, etching a trench, and trench fill. The trench fill typically includes the deposition of a trench dielectric material such as, for example, an oxide. A densification step and/or a planarization step may follow the trench fill.

In some embodiments, a second anneal at a higher temperature (on the order of greater than about 1300° C.) than the recrystallization anneal described above may be employed after formation of the STI regions. When employed, this second anneal can be used to eliminate any end-of-range defects remaining after ATR.

Figure 7A:
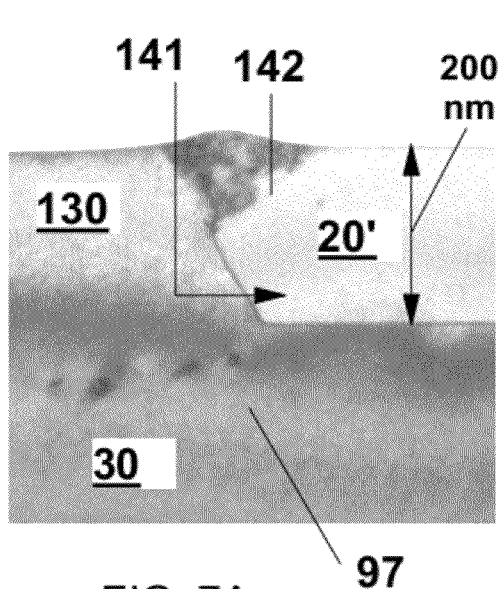
FIGS. 7A and 7B are transmission electron micrograph images comparing boundary regions produced with a prior art ATR process (FIG. 7A) and the modified ATR process of the present invention (FIG. 7B).
Figure 7B:
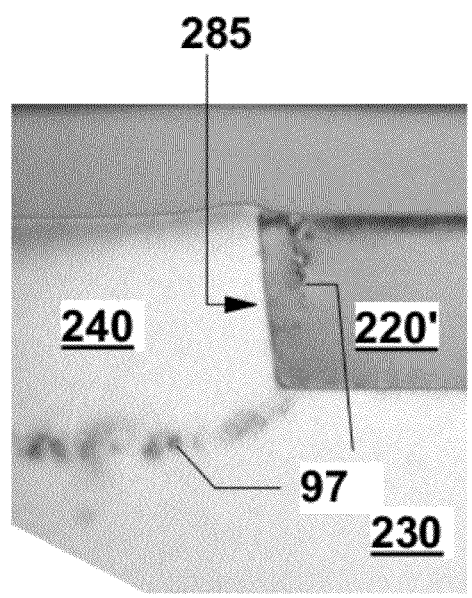

As shown in FIG. 6D, hybrid orientation substrate structure 300 includes a direct semiconductor bonded Si layer having a first region of a (011) surface orientation (i.e., the non-ATR'd regions 220') and a second region of a (001) surface orientation (i.e., the ATR'd region 240). A base silicon layer 230 is located directly beneath the direct semiconductor bonded silicon layer. This optimal arrangement of DSB layer, base substrate, and amorphized region orientation described above reduces the dimensions of the defective boundary region between first and second silicon regions, thus enabling full boundary region removal with smaller footprint STI structures than would be possible with less vertical and more defective boundaries. This is illustrated in the transmission electron micrograph images of FIG. 7, which compare a boundary region produced with a prior art ATR process (FIG. 7A) to a boundary region produced with the modified ATR process of the present invention (FIG. 7B).

Figure 8A:
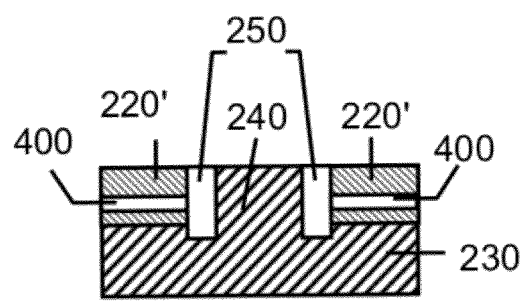
FIGS. 8A-8D are pictorial representations (through cross sectional views) depicting alternative hybrid orientation substrates that can be fabricated utilizing the method of the present invention.
Figure 8B:
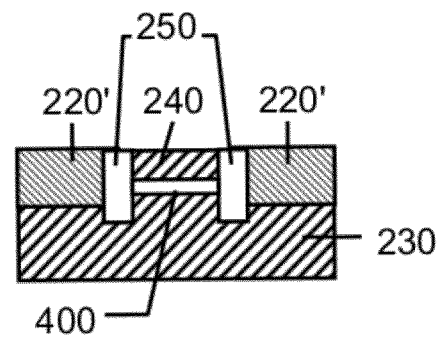
Figure 8C:
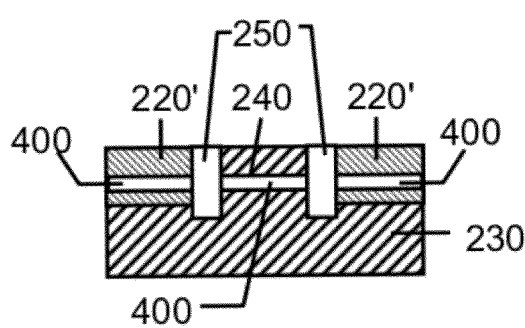
Figure 8D:
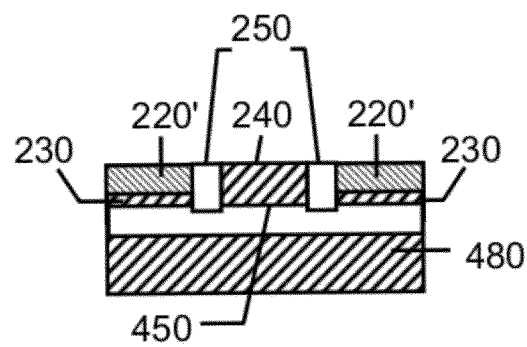

In some embodiments of the present invention, buried insulating layers (or regions) can be formed in hybrid orientation substrates by implanting ions such as, for example, oxygen-containing or nitrogen-containing ions and thereafter annealing the implanted ions. The conditions for the ion implantation and annealing used in forming the buried insulating layers (or regions) are well known to those skilled in the art. So as not to obscure the present invention, the conditions for forming the buried insulating layers (or regions) are not provided herein. FIGS. 8A, 8B, and 8C are illustrated examples of hybrid orientation substrate structures that include buried insulating layers (or regions) 400. Alternatively, buried insulating regions may be present in the starting substrate, as in the illustrated example of FIG. 8D. In this case, base silicon layer 230 is a silicon-on-insulator layer disposed on buried insulator 450 on base substrate 480.

Figure 9:
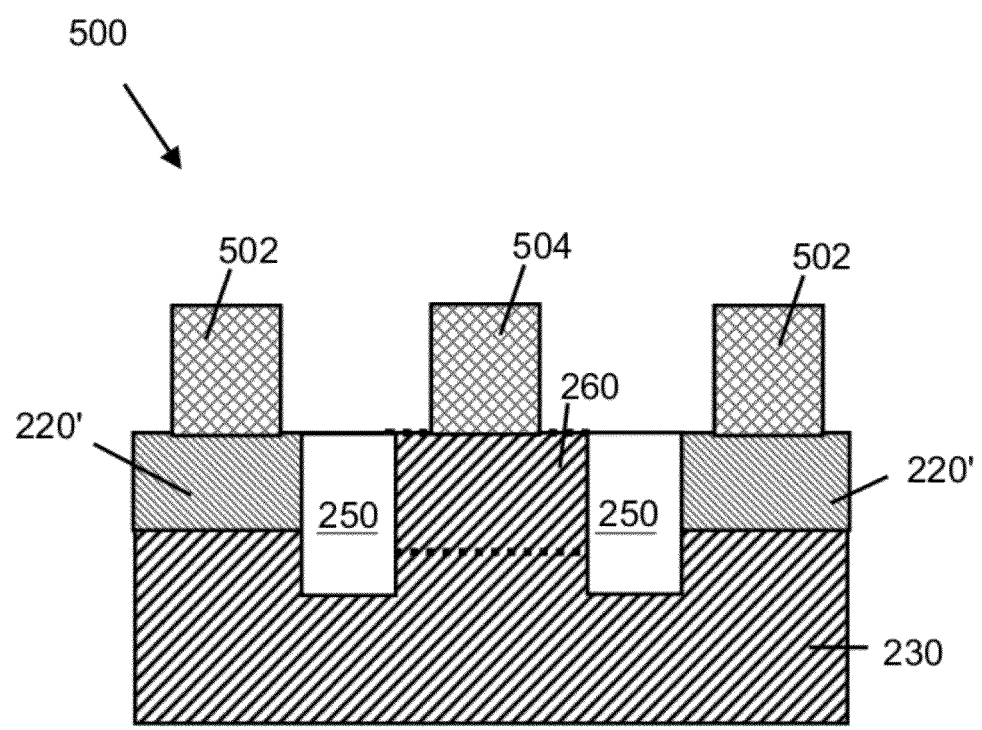
FIG. 9 is a pictorial represent (through a cross sectional view) depicting the hybrid orientation substrate of FIG. 6D including first and second devices located thereon.

Devices such as FETs and other circuit elements (not shown) would then be fabricated on hybrid orientation substrate 300 using techniques that are well known in the art. FIG. 9 illustrates a semiconductor structure 500 that includes the inventive hybrid orientation structure of FIG. 6D in which a first device 502 of a first conductivity is located upon the first region 220' (e.g., a pFET 502 would be located upon non-ATR'd region 220' having a (011) surface orientation) and a second device 504 of a second conductivity that differs from the first conductivity is located upon the second region 240 (e.g., an nFET 504 would be located on ATR'd region 240 having a (001) surface orientation). The illustrated structure includes FET devices that are fabricated utilizing techniques well known to those skilled in the art including deposition, lithography and etching. Alternatively, a replacement gate process can be used to form each FET. Each FET includes a gate dielectric (such as an oxide, nitride, and/or oxynitride), a gate conductor (such as polysilicon, SiGe, a metal, a metal alloy, a metal silicide and/or a metal nitride), at least one sidewall spacer (i.e., an oxide, nitride, and/or oxynitride), source and drain diffusion regions (i.e., doped regions present in the semiconductor wafer), and, optionally, semiconductor metal alloy layers (i.e., silicide layers located atop the source and drain diffusion regions and optionally atop the gate conductor). The FET elements are not specifically shown or labeled in the drawings.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A method of forming a hybrid semiconductor structure having at least two coplanar regions of different surface orientations and having reduced boundary defects comprising:
   providing a bilayer template stack comprising a direct semiconductor bonded (DSB) silicon layer of a (011) surface orientation disposed on a base silicon layer having a (001) surface orientation, wherein an in-plane <110> direction of the DSB silicon layer and an in-plane <110> direction of the base silicon layer are aligned to be parallel;
   implanting amorphizing ions into selected regions of the DSB silicon layer to amorphize said selected regions down to said base silicon layer, leaving original-orientation regions of the DSB silicon layer in regions not so implanted, wherein edges of said selected regions are aligned with in-plane <100> directions of the base silicon layer; and
   performing a recrystallization anneal to convert said amorphized selected regions into changed-orientation regions having the (001) surface orientation of the base silicon layer, wherein edges of said changed-orientation and original-orientation silicon regions are separated by a near-vertical boundary in a boundary region.

2. The method of claim 1 wherein said near-vertical boundary includes an angle within 15° of a vertical direction, and said edges of said selected regions are aligned within 10° of the in-plane <100> directions.

3. The method of claim 1 further comprising forming at least one trench isolation region within said bilayer template stack after performing said recrystallization anneal.

4. The method of claim 1 wherein said base silicon layer having said (001) surface orientation is a bulk wafer or a semiconductor-on-insulator wafer.

5. The method of claim 1 wherein said DSB silicon layer and said base silicon layer are silicon-containing materials selected from the group consisting of Si, SiGe, SiC, SiGeC, and multilayered stacks thereof.

6. The method of claim 1 wherein said providing the bilayer template stack includes a direct wafer bonding process that is performed at a temperature from about 15° C. to about 40° C.

7. The method of claim 6 wherein said direct wafer bonding process further includes annealing in an annealing ambient selected from $O_2$, $N_2$, Ar and vacuum and at a temperature from about 900° C. to about 1300° C.

8. The method of claim 1 wherein said amorphizing ions are selected from As, Ge, P, Si and Xe.

9. The method of claim 1 wherein said recrystallization anneal is performed at a temperature from about 500° C. to about 900° C.

10. The method of claim 3 further comprising performing an annealing after forming the at least one trench isolation region, wherein said annealing is performed at a higher temperature than the recrystallization anneal.

11. The method of claim 10 wherein said annealing is performed at a temperature of about 1300° C. or greater.

12. A method of forming a semiconductor structure comprising:
    providing a bilayer template stack comprising a direct semiconductor bonded (DSB) silicon layer of a (011) surface orientation disposed on a base silicon layer having a (001) surface orientation, wherein an in-plane <110> direction of the DSB silicon layer and an in-plane <110> direction of the base silicon layer are aligned to be parallel;
    implanting amorphizing ions into selected regions of the DSB silicon layer to amorphize the selected regions down to said base silicon layer, leaving original-orientation regions of the DSB silicon layer in regions not so implanted, wherein edges of the selected regions are aligned with in-plane <100> directions of the base silicon layer;
    performing a recrystallization anneal to convert said amorphized selected regions into changed-orientation regions having the (001) surface orientation of the base silicon layer, wherein edges of said changed-orientation and original-orientation regions are separated by a near-vertical boundary in a boundary region that is essentially defect free; and forming a first device on one of said original-orientation regions of said DSB silicon layer and forming a second device on one of said changed-orientation regions of said DSB silicon layer.

13. The method of claim 12 wherein said near-vertical boundary includes an angle within 15° of a vertical direction, and said edges of the selected regions are aligned within 10° of the in-plane <100> directions.

14. The method of claim 12 further comprising forming at least one trench isolation region within said bilayer template stack after performing said recrystallization anneal.

15. The method of claim 12 wherein said base silicon layer having said (001) surface orientation is a bulk wafer or a semiconductor-on-insulator wafer.

16. The method of claim 12 wherein said DSB silicon layer and said base silicon layer are silicon-containing materials selected from the group consisting of Si, SiGe, SiC, SiGeC, and multilayered stacks thereof.

17. The method of claim 12 wherein said first device is a p-channel field effect transistor (pFET) and said one of said original-orientation regions has a (110) surface orientation and wherein said second device is an n-channel field effect transistor (nFET) and said one of said changed-orientation regions has a (100) surface orientation.

18. The method of claim 12 wherein said amorphizing ions are selected from As, Ge, P, Si and Xe.

19. The method of claim 12 wherein said recrystallization anneal is performed at a temperature from about 500° C. to about 900° C.

20. The method of claim 14 further comprising performing an annealing after forming the at least one trench isolation region, wherein said annealing is performed at a temperature of about 1300° C. or greater.

* * * * *